(12) United States Patent
Maeda

(10) Patent No.: US 6,852,767 B2
(45) Date of Patent: Feb. 8, 2005

(54) ACTIVE ENERGY BEAM CURABLE COMPOSITION HAVING PREDETERMINED ACID VALUE OR AMINE VALUE AND INK CONTAINING THE SAME

(75) Inventor: Minobu Maeda, Kounan (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 195 days.

(21) Appl. No.: 10/097,353

(22) Filed: Mar. 15, 2002

(65) Prior Publication Data

US 2002/0188033 A1 Dec. 12, 2002

(30) Foreign Application Priority Data

Mar. 19, 2001 (JP) ........................................ 2001-078526
May 11, 2001 (JP) ........................................ 2001-141703

(51) Int. Cl.$^7$ ........................... C09D 11/10; C08L 63/00
(52) U.S. Cl. ............................. 522/75; 522/81; 522/25; 522/31; 522/83; 522/170; 522/181
(58) Field of Search .............................. 522/25, 31, 75, 522/81, 83, 170, 181, 84

(56) References Cited

U.S. PATENT DOCUMENTS 5,658,964 A * 8/1997 Amon et al. ................... 522/31
5,861,447 A * 1/1999 Nagasawa et al. .......... 523/161

FOREIGN PATENT DOCUMENTS

EP 0 844 255 A1 5/1998
WO WO 00/01777 1/2000

* cited by examiner

*Primary Examiner*—Susan Berman
(74) *Attorney, Agent, or Firm*—Oliff & Berridge, PLC

(57) ABSTRACT

A photo-curing ink composition comprises a photocation-polymerizable substance, a photocation polymerization initiator, and a surfactant having a functional group. The surfactant is selected and the amount thereof is adjusted so that the acid value per 100 g of the ink composition is not more than 150 mg KOH. The surfactant is selected and the amount thereof is adjusted so that the amine value per 100 g of the ink composition is not more than 23 mg KOH. The ink composition is excellent in dispersion performance, storage stability, and curing performance.

16 Claims, No Drawings

US 6,852,767 B2

ACTIVE ENERGY BEAM CURABLE COMPOSITION HAVING PREDETERMINED ACID VALUE OR AMINE VALUE AND INK CONTAINING THE SAME

BACKGROUND OF THE INVENTION

1. Field of the Invention

The present invention relates to an active energy beam curable composition and an ink which are excellent in storage stability and which are cured quickly.

2. Description of the Related Art

The active energy beam curable composition including, for example, ultraviolet light curable resins and electron beam curable resins has been hitherto used in many fields including, for example, inks, paints, adhesives, resists, and plate-making materials, by making the use of such a characteristic that the active energy beam curable composition maintains a liquid state in the dark, and the composition is cured when the composition is exposed to an active energy beam such as a light beam and an electron beam after being applied to an objective.

The active energy beam curable composition contains, for example, a photocation-polymerizable resin and a photocation polymerization initiator. The composition maintains the liquid state in the dark, because neither polymerization reaction nor cross-linking reaction occurs. On the other hand, when the composition is exposed to the light having a predetermined wavelength, then the polymerization reaction or the cross-linking reaction takes place, and thus the composition is cured.

Especially, when the active energy beam curable composition is used as an ink or a paint, a coloring agent such as a pigment is added. In this case, in order to improve the dispersion performance for the pigment or the like, a surfactant, which has a polar functional group (for example, an acidic functional group such as carboxyl group or a basic functional group such as amino group), is added.

The surfactant provides such an effect that the pigment dispersion performance is improved by making adsorption to the surface of the pigment by the aid of the polar functional group possessed by the surfactant.

However, when the surfactant having the polar functional group is added to the active energy beam curable composition, the storage stability of the active energy beam curable composition is deteriorated depending on the type of the surfactant. Consequently, for example, the active energy beam curable composition is cured in some cases, even when the composition is stored in the dark.

On the contrary, the curing performance of the active energy beam curable composition is deteriorated depending on the surfactant to be added. Consequently, for example, the active energy beam curable composition fails to cure sufficiently in some cases, even when the composition is exposed to the light after being applied to an objective.

SUMMARY OF THE INVENTION

The present invention has been made taking the foregoing problems into consideration, an object of which is to provide an active energy beam curable composition and an ink which have satisfactory pigment dispersion performance and which are excellent in storage stability and curing performance.

According to a first aspect of the present invention, there is provided an active energy beam curable composition comprising a photocation-polymerizable substance; a photocation polymerization initiator; and a surfactant having a functional group; wherein an acid value per 100 g of the active energy beam curable composition is not more than 150 mg KOH.

The active energy beam curable composition of the present invention has such a feature that the polymerization reaction scarcely proceeds in the dark owing to the fact that the acid value per 100 g of the active energy beam curable composition is not more than 150 mg KOH, although the composition contains the surfactant having the functional group. If the acid value exceeds 150 mg KOH, then the amount of supply of hydrogen ion is increased, and the cationic polymerization tends to proceed even when the active energy beam is not radiated.

Therefore, the active energy beam curable composition is not cured even after the composition is stored in the dark for a long period of time, and thus the composition is excellent in storage stability.

The active energy beam curable composition of the present invention has such a characteristic that the composition is cured in accordance with the polymerization reaction when the composition is exposed to the light having a predetermined wavelength. The active energy beam curable composition of the present invention can be used for the way of use including, for example, the ink, the paint, the adhesive, the resist, and the plate-making material.

Further, the active energy beam curable composition of the present invention contains the surfactant which has a polar functional group as a matter of course as well as a functional group which expresses the function as a dispersing agent. Therefore, the active energy beam curable composition of the present invention has such a feature that the dispersion performance is satisfactory for the dye or the pigment, for example, even when the composition is blended with the dye or the pigment.

The photocation-polymerizable substance is contained together with the photocation polymerization initiator. The photocation-polymerizable substance is cured by causing the polymerization reaction and/or the cross-linking reaction when the substance is exposed to a light beam having a predetermined wavelength. The photocation-polymerizable substance includes, for example, epoxy compound, oxetane compound, oxolane compound, cyclic acetal compound, cyclic lactone compound, thiirane compound, thietane compound, vinyl ether compound, spiroorthoester compound as reaction product of epoxy compound and lactone, ethylenic unsaturated compound, cyclic ether compound, cyclic thioether compound, and vinyl compound.

Those usable as the photocation-polymerizable substance include, for example, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, limonene dioxide, limonene monoxide, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene epoxide, di(3,4-epoxycyclohexylmethyl)ether of ethylene glycol, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerol triglycidyl ether, trimethylol propane triglycidyl ether, polyethylene glycol diglycidyl ether, polypropylene glycol diglycidyl ether; polyglycidyl ether of polyether polyol obtained by adding one or more alkylene oxides to aliphatic polyhydric alcohol such as ethylene glycol, propylene glycol, and glycerol; diglycidyl ester of aliphatic long chain dibasic acid; monoglycidyl ether of aliphatic higher alcohol; phenol, cresol, and butylphenol or monoglycidyl ether of polyether alcohol obtained by adding alkylene oxide to phenol, cresol, or butylphenol; glycidyl ester of higher fatty acid; and epoxidated soybean oil, butyl epoxystearate, octyl epoxystearate, epoxidated linseed oil, and epoxidated polybutadiene.

Other compounds, which are usable as the photocation-polymerizable substance, include, for example, oxetane such as trimethylene oxide, 3,3-dicyclomethyloxetane, 3-ethyl-3-phenoxymehtyloxetane, and bis(3-ethyl-3-methyloxy)butane; oxolane such as tetrahydrofuran and 2,3-dimethyltetrahydrofuran; cyclic acetal such as trioxane, 1,3-dioxolane, and 1,3,6-trioxolanecyclooctane; cyclic lactone such as β-propiolactone and ε-caprolactone; triirane such as ethylene sulfide, 1,2-propylene sulfide, and thioepichlorohydrin; thietane such as 3,3-dimethylthietane; vinyl ether such as ethylene glycol divinyl ether, triethylene glycol divinyl ether, trimethylolpropane trivinyl ether, triethylene glycol monobutyl vinyl ether, cyclohexanedimethanol divinyl ether, hydroxydibutyl vinyl ether, dodecyl vinyl ether, propenyl ether propylene carbonate, methyl vinyl ether, ethyl vinyl ether, propyl vinyl ether, isobutyl vinyl ether, ethylene glycol monovinyl ether, diethylene glycol divinyl ether, butanediol divinyl ether, hexanediol divinyl ether, cyclohexanedimethanol monovinyl ether, cyclohexyl vinyl ether, 2-chloroethyl vinyl ether, 2-hydroxyethyl vinyl ether, diethylene glycol vinyl ether, 2,2-bis(4-vinyloxyethoxyphenyl)propane, and 1,4-bis(2-vinyloxyethoxy)benzene, specifically RAPID-CURE DVE-3, RAPID-CURE CHVE, RAPID-CURE HBVE, RAPID-CURE PECP, and RAPID-CURE DDVE (produced by ISP), VECTOMER 4010 (produced by Allied Signal), M-VE, E-VE, P-VE, iB-VE, EG-VE, EG-MVE, DGE-DVE, BD-DVE, HD-DVE, CHDM-DVE, and CH-VE (produced by BASF), and CEVE, HEVE, DEG-DVE, TEG-DVE, PBA-DEVE, and HQ-DEVE (produced by Nisso Maruzen Chemical); spiroorthoester obtained by reaction of epoxy compound and lactone; ethylenic unsaturated compound such as vinylcyclohexane, isobutylene, and polybutadiene; and derivatives of the respective compounds.

Among the photocation-polymerizable substances described above, it is preferable to use bisphenol A diglycidyl ether, bisphenol F diglycidyl ether, hydrogenated bisphenol A diglycidyl ether, hydrogenated bisphenol F diglycidyl ether, 3,4-epoxycyclohexylmethyl-3',4'-epoxycyclohexane carboxylate, bis(3,4-epoxycyclohexylmethyl)adipate, 1,4-butanediol diglycidyl ether, 1,6-hexanediol diglycidyl ether, glycerol triglycidyl ether, trimethylol propane triglycidyl ether, polyethylene glycol diglycidyl ether, and polypropylene glycol diglycidyl ether.

Cation-polymerizable compounds, which are especially preferred as the photocation-polymerizable substance, include, for example, triethylene glycol divinyl ether and epoxy compound having two or more alicyclic epoxy groups in one molecule, such as 3,4-epoxycyclohexylmethyl-3',4'-epoxycyclohexane carboxylate, bis(3,4-epoxycyclohexylmethyl)adipate, limonene dioxide, and limonene monoxide.

The photocation polymerization initiator is a substance which serves to initiate the polymerization reaction and/or the cross-linking reaction of the photocation-polymerizable substance by being exposed to a light beam having a predetermined wavelength. The photocation polymerization initiator includes, for example, compounds as described on pp. 63 to 65 of Section 3.1.5 of "UV/EB Curable Materials" (published in 1992 by CMC). Most preferably, the photocation polymerization initiators described above are exemplified by diaryliodonium salt and triarylsulfonium salt, more specifically mixture of hexafluorophosphate of triarylsulfonium and propylene carbonate.

The acid value refers to the acid value per 100 parts by weight of the active energy beam curable composition. The acid value can be measured, for example, by means of the potentiometric titration method with an ethanol-potassium hydroxide standard solution.

The functional group of the surfactant includes, for example, hydroxyl group, carboxyl group, amino group, sulfate ester group, sulfonic acid group, and phosphate ester group. It is appropriate to use those which express the function as a dispersing agent. It is possible to add alkyl group.

The surfactant includes, for example, anionic surfactant, cationic surfactant, ampholytic surfactant, and nonionic surfactant.

The active energy beam curable composition of the present invention has not only a feature that the acid value is not more than 150 mg KOH, but the active energy beam curable composition of the present invention may also have such a feature that an amine value is not more than 23 mg KOH.

The active energy beam curable composition of the present invention has such a feature that the composition is quickly cured when the composition is irradiated with a light beam having a predetermined wavelength (for example, an ultraviolet light beam and an electron beam), owing to the fact that the amine value is not more than 23 mg KOH, although the composition contains the surfactant having the polar functional group.

In other words, the active energy beam curable composition has such an advantage that the composition is cured in a short period of time after being applied to an objective, for example, when the composition is used for the ink, the paint, the adhesive, the resist, or the plate-making material.

The amine value refers to the amine value per 100 parts by weight of the active energy beam curable composition. The amine value can be measured, for example, by means of the titration method with an ethanol-hydrochloric acid standard solution with an indicator of BCG.

The acid value per 100 g of the active energy beam curable composition may be not less than 0.5 mg KOH. The active energy beam curable composition of the present invention has such a feature that the dispersion performance is excellent, for example, when the pigment is blended, owing to the fact that the acid value is not less than 0.5 mg KOH.

In the active energy beam curable composition of the present invention, the acid value may be determined by the amount of the acidic functional group possessed by the contained surfactant.

According to a second aspect of the present invention, there is provided an active energy beam curable composition comprising a photocation-polymerizable substance; a photocation polymerization initiator; and a surfactant having a functional group; wherein an amine value per 100 g of the active energy beam curable composition is not more than 23 mg KOH.

The active energy beam curable composition of the present invention has such a feature that the composition is quickly cured when the composition is irradiated with a light beam having a predetermined wavelength (for example, an ultraviolet light beam and an electron beam), owing to the fact that the amine value per 100 g of the active energy beam curable composition is not more than 23 mg KOH, although the composition contains the surfactant having the polar functional group. If the amine value exceeds 23 mg KOH, the hydrogen ion, which advances the cationic polymerization under the radiation beam, disappears.

In other words, the active energy beam curable composition has such an advantage that the composition is cured in a short period of time after being applied to an objective, for example, when the composition is used for the ink, the paint, the adhesive, the resist, or the plate-making material.

Further, the active energy beam curable composition of the present invention contains the surfactant which has the polar functional group. Therefore, the active energy beam curable composition of the present invention has such a feature that the dispersion performance is satisfactory for the dye or the pigment, for example, even when the composition is blended with the dye or the pigment. Those referred to above may be exemplified as the photocation-polymerizable substance, the photocation polymerization initiator, the polar functional group, and the surfactant.

In the present invention, the amine value may be determined by an amount of basic functional group possessed by the surfactant. The amine value per 100 g of the active energy beam curable composition may be not less than 0.5 mg KOH. The active energy beam curable composition of the present invention has such a feature that the dispersion performance is excellent, for example, when the pigment is blended, owing to the fact that the amine value per 100 g is not less than 0.5 mg KOH.

The active energy beam curable composition may further comprise a pigment and/or a dye. The active energy beam curable composition of the present invention contains either the pigment or the dye or both of the pigment and the dye. The surfactant, which has the polar functional group, for example, adsorbs to the surface of particles of the pigment or the dye by the aid of the polar functional group. Accordingly, the dispersion performance is enhanced for the pigment or the dye. The active energy beam curable composition can be used, for example, as the ink or the paint.

It is enough for the active energy beam curable composition of the present invention that the acid value or the amine value is not zero. It is preferable to contain the surfactant having the polar functional group so that the acid value is not less than 0.5 mg KOH (preferably not less than 5 mg KOH), or the amine value is not less than 0.5 mg KOH (preferably not less than 5 mg KOH), in order to enhance the dispersion performance for the pigment and/or the dye. If both of the acid value and the amine value are zero, the dispersion performance is inferior, even if an obtained composition is excellent in storage stability in the dark and in quick curing characteristic.

In the active energy beam curable composition, the photocation-polymerizable substance may contain an epoxy resin compound. When the photocation-polymerizable substance contains the epoxy resin compound, an effect is obtained such that the composition is cured more quickly when the composition is irradiated with a light beam having a predetermined wavelength.

The epoxy resin compound includes, for example, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, limonene dioxide, limonene monoxide, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene epoxide, di(3,4-epoxycyclohexylmethyl)ether of ethylene glycol, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerol triglycidyl ether, trimethylol propane triglycidyl ether, polyethylene glycol diglycidyl ether, polypropylene glycol diglycidyl ether; polyglycidyl ether of polyether polyol obtained by adding one or more alkylene oxides to aliphatic polyhydric alcohol such as ethylene glycol, propylene glycol, and glycerol; diglycidyl ester of aliphatic long chain dibasic acid; monoglycidyl ether of aliphatic higher alcohol; phenol, cresol, and butylphenol or monoglycidyl ether of polyether alcohol obtained by adding alkylene oxide to phenol, cresol, or butylphenol; glycidyl ester of higher fatty acid; and epoxidated soybean oil, butyl epoxystearate, octyl epoxystearate, epoxidated linseed oil, and epoxidated polybutadiene.

The epoxy resin compound may be an alicyclic epoxy resin compound. An effect is obtained such that the curing performance is further improved, owing to the fact that the epoxy resin compound is the alicyclic epoxy resin compound.

The alicyclic epoxy resin compound includes, for example, 3,4-epoxycyclohexyl-3,4-epoxycyclohexane carboxylate and bis(3,4-epoxycyclohexylmethyl)adipate.

The photocation-polymerizable substance may contain a vinyl ether compound. An effect is obtained such that the composition is quickly cured, owing to the fact that the photocation-polymerizable substance contains the vinyl ether compound.

The vinyl ether compound includes, for example, triethylene glycol divinyl ether, cyclohexanedimethanol divinyl ether, hydroxydibutyl vinyl ether, dodecyl vinyl ether, propenyl ether propylene carbonate, methyl vinyl ether, ethyl vinyl ether, propyl vinyl ether, isobutyl vinyl ether, ethylene glycol monovinyl ether, diethylene glycol divinyl ether, butanediol divinyl ether, hexanediol divinyl ether, cyclohexanedimethanol monovinyl ether, cyclohexyl vinyl ether, 2-chloroethyl vinyl ether, 2-hydroxyethyl vinyl ether, diethylene glycol vinyl ether, 2,2-bis(4-vinyloxyethoxyphenyl)propane, and 1,4-bis(2-vinyloxyethoxy)benzene, specifically RAPID-CURE DVE-3, RAPID-CURE CHVE, RAPID-CURE HBVE, RAPID-CURE PECP, and RAPID-CURE DDVE (produced by ISP), VECTOMER 4010 (produced by Allied Signal), M-VE, E-VE, P-VE, iB-VE, EG-VE, EG-MVE, DGE-DVE, BD-DVE, HD-DVE, CHDM-DVE, and CH-VE (produced by BASF), and CEVE, HEVE, DEG-DVE, TEG-DVE, PBA-DEVE, and HQ-DEVE (produced by Nisso Maruzen Chemical).

The photocation polymerization initiator may contain an onium salt. An effect is obtained such that the highly sensitive curing characteristic with respect to the irradiation with the light can be realized, owing to the fact that the photocation-polymerizable substance contains the onium salt.

The onium salt includes, for example, UVI-6950, UVI-6970, UVI-6974, and UVI-6990 (produced by Union Carbide), ADEKA Optomers SP-150, SP-151, SP-170, and SP-171 (produced by Asahi Denka Kogyo), IRGACURE 261 (produced by Chiba-Geigy), CI-2481, CI-2624, CI-2689, and CI-2064 (produced by Nippon Soda), CD-1010, CD-1011, and CD-1012 (produced by Sartomer), and DTS-102, DTS-103, NAT-103, NDS-103, TPS-103, MDS-103, MPI-103, and BBI-103 (produced by Midori Kagaku).

According to a third aspect of the present invention, there is provided an ink comprising the composition according to the first aspect and a pigment and/or a dye. According to a fourth aspect of the present invention, there is provided an ink comprising the composition according to the second aspect and a pigment and/or a dye. The ink of the present invention has the acid value and the amine value which are lower then the predetermined values (the acid value is not more than 150 mg KOH, and the amine value is not more than 23 mg KOH). Accordingly, the ink of the present invention has the excellent characteristics.

That is, when the acid value is not more than 150 mg KOH and not less than 0.5 mg KOH, the ink of the present invention is excellent in storage stability in the dark. When the amine value is not more than 23 mg KOH and not less than 0.5 mg KOH, the ink of the present invention is excellent in curing performance when the ink is exposed to a light beam having a predetermined wavelength.

Further, the ink contains the surfactant having the polar functional group, and the surfactant adsorbs to the pigment or the dye, for example, by the aid of the polar functional group. Accordingly, the ink has such a feature that the dispersion performance is satisfactory for the pigment or the dye. Additionally, when the ink is actually used, the ink has such a feature that the ink is adapted in a well-suited manner to a variety of types of paper (for example, neutral paper, acidic paper, and regular paper) to serve as recording medium, and the ink surface after the printing or application is excellent in smoothness and flexibility.

DESCRIPTION OF THE PREFERRED EMBODIMENTS

Illustrative embodiments (Examples) of the ink (active energy beam curable composition) of the present invention will be explained below.

1. Preparation of Inks

At first, explanation will be made for inks (active energy beam curable compositions) obtained in Working Examples and Comparative Examples.

EXAMPLE 1

Ink 1 was produced by agitating and mixing the following components at room temperature in a dark room.

Photocation-polymerizable resin: 3,4-epoxycyclohexyl-3,4-epoxycyclohexane carboxylate (trade name: UVR-6110, produced by Union Carbide), 70 parts by weight;

Photocation-polymerizable resin: triethylene glycol divinyl ether (trade name: DVE-3, produced by ISP), 30 parts by weight;

Photocation polymerization initiator: mixture of hexafluorophosphate of triarylsulfonium and propylene carbonate (trade name: UVI-6990, produced by Union Carbide, active ingredient: 50%), 4 parts by weight;

Surfactant: Anti-terra-U (trade name, produced by BYK-Chemie), 1.5 part by weight.

As for Ink 1, the acid value per 100 parts by weight is 36 mg KOH, and the amine value per 100 parts by weight is 28.5 mg KOH.

EXAMPLE 2

Ink 2 was produced in the same manner as in Example 1 except that the surfactant was 1.5 part by weight of DISPARLON PW-36 (trade name, produced by Kusumoto Chemicals). As for Ink 2, the acid value per 100 parts by weight is 82.5 mg KOH.

EXAMPLE 3

Ink 3 was produced in the same manner as in Example 1 except that the surfactant was 1.5 part by weight of DISPARLON DA-325 (trade name, produced by Kusumoto Chemicals). As for Ink 3, the acid value per 100 parts by weight is 21 mg KOH.

EXAMPLE 4

Ink 4 was produced in the same manner as in Example 1 except that the surfactant was 1.5 part by weight of DISPARLON 3600N (trade name, produced by Kusumoto Chemicals). As for Ink 4, the acid value per 100 parts by weight is 39 mg KOH.

EXAMPLE 5

Ink 5 was produced in the same manner as in Example 1 except that the surfactant was 1.5 part by weight of BYK-220S (trade name, produced by BYK-Chemie). As for Ink 5, the acid value per 100 parts by weight is 150 mg KOH.

EXAMPLE 6

Ink 6 was produced in the same manner as in Example 1 except that the surfactant was 1.5 part by weight of PN411 (trade name, produced by Ajinomoto). As for Ink 6, the acid value per 100 parts by weight is 9 mg KOH.

EXAMPLE 7

Ink 7 was produced in the same manner as in Example 1 except that the surfactant was 0.5 part by weight of the surfactant used in Example 6. As for Ink 7, the acid value per 100 parts by weight is 3 mg KOH.

EXAMPLE 8

Ink 8 was produced in the same manner as in Example 1 except that the surfactant was 0.2 part by weight of the surfactant used in Example 6. As for Ink 8, the acid value per 100 parts by weight is 1.2 mg KOH.

EXAMPLE 9

Ink 9 was produced in the same manner as in Example 1 except that the surfactant was 0.1 part by weight of the surfactant used in Example 6. As for Ink 9, the acid value per 100 parts by weight is 0.6 mg KOH.

EXAMPLE 10

Ink 10 was produced in the same manner as in Example 1 except that the surfactant was 1.5 part by weight of EFKA-4010 (trade name, produced by EFKA). As for Ink 10, the acid value per 100 parts by weight is 22.5 mg KOH, and the amine value per 100 parts by weight is 12 mg KOH.

EXAMPLE 11

Ink 11 was produced in the same manner as in Example 1 except that the surfactant was 1.5 part by weight of EFKA-4050 (trade name, produced by EFKA). As for Ink 11, the amine value per 100 parts by weight is 22.95 mg KOH.

EXAMPLE 12

Ink 12 was produced in the same manner as in Example 1 except that the surfactant was 1.5 part by weight of DISPERBYK 162 (trade name, produced by BYK-Chemie). As for Ink 12, the amine value per 100 parts by weight is 19.5 mg KOH.

EXAMPLE 13

Ink 13 was produced in the same manner as in Example 1 except that the surfactant was 1.0 part by weight of EFKA-46 (trade name, produced by EFKA). As for Ink 13, the amine value per 100 parts by weight is 16 mg KOH.

EXAMPLE 14

Ink 14 was produced in the same manner as in Example 1 except that the surfactant was 0.5 part by weight of the surfactant used in Example 13. As for Ink 14, the amine value per 100 parts by weight is 8 mg KOH.

EXAMPLE 15

Ink 15 was produced in the same manner as in Example 1 except that the surfactant was 0.2 part by weight of the surfactant used in Example 13. As for Ink 15, the amine value per 100 parts by weight is 3.2 mg KOH.

EXAMPLE 16

Ink 16 was produced in the same manner as in Example 1 except that the surfactant was 0.1 part by weight of the surfactant used in Example 13. As for Ink 16, the amine value per 100 parts by weight is 1.6 mg KOH.

EXAMPLE 17

Ink 17 was produced in the same manner as in Example 1 except that the surfactant was 0.05 part by weight of the surfactant used in Example 13. As for Ink 17, the amine value per 100 parts by weight is 0.8 mg KOH.

EXAMPLE 18

Ink 18 was produced in the same manner as in Example 1 except that the surfactant was 0.5 part by weight of DISPERBYK 2001 (trade name, produce by BYK-Chemie). As for Ink 18, the amine value per 100 parts by weight is 14.5 mg KOH.

Comparative Example 1

Ink 51 was produced in the same manner as in Example 1 except that the surfactant was not contained.

Comparative Example 2

Ink 52 was produced in the same manner as in Example 1 except that the surfactant was 1.5 part by weight of DISPARLON 2150 (trade name, produced by Kusumoto Chemicals). As for Ink 52, the acid value per 100 parts by weight is 210 mg KOH.

Comparative Example 3

Ink 53 was produced in the same manner as in Example 1 except that the surfactant was 1.5 part by weight of DISPARLON 1210 (trade name, produced by Kusumoto Chemicals). As for Ink 53, the acid value per 100 parts by weight is 255 mg KOH.

Comparative Example 4

Ink 54 was produced in the same manner as in Example 1 except that the surfactant was 1.5 part by weight of BYK-104S (trade name, produced by BYK-Chemie). As for Ink 54, the acid value per 100 parts by weight is 225 mg KOH.

Comparative Example 5

Ink 55 was produced in the same manner as in Example 1 except that the surfactant was 1.5 part by weight of BYK-104 (trade name, produced by BYK-Chemie). As for Ink 55, the acid value per 100 parts by weight is 270 mg KOH.

Comparative Example 6

Ink 56 was produced in the same manner as in Example 1 except that the surfactant was 1.5 part by weight of EFKA-46 (trade name, produced by EFKA). As for Ink 56, the amine value per 100 parts by weight is 24 mg KOH.

Comparative Example 7

Ink 57 was produced in the same manner as in Example 1 except that the surfactant was 1.5 part by weight of EFKA-47 (trade name, produced by EFKA). As for Ink 57, the amine value per 100 parts by weight is 31.5 mg KOH.

Comparative Example 8

Ink 58 was produced in the same manner as in Example 1 except that the surfactant was 1.5 part by weight of EFKA-401 (trade name, produced by EFKA). As for Ink 58, the amine value per 100 parts by weight is 78 mg KOH.

Comparative Example 9

Ink 59 was produced in the same manner as in Example 1 except that the surfactant was 1.5 part by weight of DISPERBYK 2001 (trade name, produce by BYK-Chemie). As for Ink 59, the amine value per 100 parts by weight is 43.5 mg KOH.

Comparative Example 10

Ink 60 was produced in the same manner as in Example 1 except that the surfactant was 2.0 part by weight of EFKA-4050 (trade name, produced by EFKA). As for Ink 60, the amine value per 100 parts by weight is 34 mg KOH.

Comparative Example 11

Ink 61 was produced in the same manner as in Example 1 except that the surfactant was 2.0 part by weight of EFKA-4055 (trade name, produced by EFKA). As for Ink 61, the amine value per 100 parts by weight is 32 mg KOH.

Comparative Example 12

Ink 62 was produced in the same manner as in Example 1 except that the surfactant was 1.0 part by weight of DISPERBYK 2001 (trade name, produced by BYK-Chemie). As for Ink 62, the amine value per 100 parts by weight is 29 mg KOH.

The acid values and the amine values of the surfactants themselves used for Examples 1 to 18 and Comparative Examples 1 to 12 are shown in Table 1. Further, the acid values and the amine values of 100 parts by weight of Inks 1 to 18 and Inks 51 to 62 are shown in Table 2.

TABLE 1

| | | Surfactant | | |
|---|---|---|---|---|
| | Ink | Name | Acid value (mg KOH/g) | Amine value (mg KOH/g) |
| Example 1 | 1 | Anti-Terra-U | 24 | 19 |
| Example 2 | 2 | DISPARLON PW-36 | 55 | |
| Example 3 | 3 | DISPARLON DA-325 | 14 | |
| Example 4 | 4 | DISPARLON 3600N | 26 | |
| Example 5 | 5 | BYK-220S | 100 | |
| Example 6 | 6 | PN411 | 6 | |
| Example 7 | 7 | PN411 | 6 | |
| Example 8 | 8 | PN411 | 6 | |
| Example 9 | 9 | PN411 | 6 | |
| Example 10 | 10 | EFKA-4010 | 15 | 8 |
| Example 11 | 11 | EFKA-4050 | | 17 |
| Example 12 | 12 | DISPERBYK 162 | | 13 |
| Example 13 | 13 | EFKA-46 | | 16 |
| Example 14 | 14 | EFKA-46 | | 16 |
| Example 15 | 15 | EFKA-46 | | 16 |
| Example 16 | 16 | EFKA-46 | | 16 |
| Example 17 | 17 | EFKA-46 | | 16 |
| Example 18 | 18 | DISPERBYK 2001 | 19 | 29 |
| Com. Ex. 1 | 51 | (not added) | — | — |
| Com. Ex. 2 | 52 | DISPARLON 2150 | 140 | |
| Com. Ex. 3 | 53 | DISPARLON 1210 | 170 | |
| Com. Ex. 4 | 54 | BYK-104S | 150 | |
| Com. Ex. 5 | 55 | BYK-P104 | 180 | |
| Com. Ex. 6 | 56 | EFKA-46 | | 16 |
| Com. Ex. 7 | 57 | EFKA-47 | | 21 |
| Com. Ex. 8 | 58 | EFKA-401 | | 52 |
| Com. Ex. 9 | 59 | DISPERBYK 2001 | | 29 |
| Com. Ex. 10 | 60 | EFKA-4050 | | 17 |
| Com. Ex. 11 | 61 | EFKA-4055 | | 16 |
| Com. Ex. 12 | 62 | DISPERBYK 2001 | | 29 |

TABLE 2

| | | Amount of added surfactant per 100 of ink | Acid value and amine value per 100 of ink (mg KOH) | |
|---|---|---|---|---|
| | Ink | (parts by weight) | Acid value | Amine value |
| Example 1 | 1 | 1.5 | 36 | |
| Example 2 | 2 | 1.5 | 82.5 | |
| Example 3 | 3 | 1.5 | 21 | |
| Example 4 | 4 | 1.5 | 39 | |
| Example 5 | 5 | 1.5 | 150 | |
| Example 6 | 6 | 1.5 | 9 | |
| Example 7 | 7 | 0.5 | 3 | |
| Example 8 | 8 | 0.2 | 1.2 | |
| Example 9 | 9 | 0.1 | 0.6 | |
| Example 10 | 10 | 1.5 | 22.5 | 12 |
| Example 11 | 11 | 1.5 | | 22.95 |
| Example 12 | 12 | 1.5 | | 19.5 |
| Example 13 | 13 | 1.0 | | 16 |
| Example 14 | 14 | 0.5 | | 8 |
| Example 15 | 15 | 0.2 | | 3.2 |
| Example 16 | 16 | 0.1 | | 1.6 |
| Example 17 | 17 | 0.05 | | 0.8 |
| Example 18 | 18 | 0.5 | | 14.5 |
| Com. Ex. 1 | 51 | 0 | 0 | 0 |
| Com. Ex. 2 | 52 | 1.5 | 210 | |
| Com. Ex. 3 | 53 | 1.5 | 255 | |
| Com. Ex. 4 | 54 | 1.5 | 225 | |

TABLE 2-continued

| | | Amount of added surfactant per 100 of ink | Acid value and amine value per 100 of ink (mg KOH) | |
|---|---|---|---|---|
| | Ink | (parts by weight) | Acid value | Amine value |
| Com. Ex. 5 | 55 | 1.5 | 270 | |
| Com. Ex. 6 | 56 | 1.5 | | 24 |
| Com. Ex. 7 | 57 | 1.5 | | 31.5 |
| Com. Ex. 8 | 58 | 1.5 | | 78 |
| Com. Ex. 9 | 59 | 1.5 | | 43.5 |
| Com. Ex. 10 | 60 | 2.0 | | 34 |
| Com. Ex. 11 | 61 | 2.0 | | 32 |
| Com. Ex. 12 | 62 | 1.0 | | 29 |

2. Evaluation of Storage Stability and Curing Performance

Next, explanation will be made for tests performed to confirm the storage stability and the curing performance of Inks 1 to 18 obtained in Examples of the present invention and Inks 51 to 62 (Exemplary Experiment 1).

The storage stability was evaluated as follows for Inks 1 to 10 produced in Examples 1 to 10 and for Inks 51 to 55 produced in Comparative Example 1 to 5.

If the storage stability is unsatisfactory, then the polymerization reaction or the cross-linking reaction occurs, and the viscosity of the ink is increased. Accordingly, the change of the viscosity of the ink before and after being left to stand in the dark was used as an index to evaluate the storage stability of the ink.

(1) Method for Evaluating Storage Stability (i) The viscosity of each of the inks was measured at 25° C. by using a rotary Brookfield type viscometer (Brook Field DV-II) immediately after producing Inks 1 to 10 and Inks 51 to 55.

(ii) The respective inks were left to stand for 2 weeks in a constant temperature bath in which the temperature was maintained at 50° C. and the interior was a dark room.

(iii) After the inks were taken out of the constant temperature bath, the viscosity was measured for each of the inks in the same manner as in (i) described above.

The rate of viscosity increase was calculated as follows by using the viscosities obtained before and after being left to stand in the constant temperature bath.

Rate of viscosity increase (%)=[{(viscosity after being left)−(viscosity before being left)}/(viscosity before being left)]×100

(2) Result of Evaluation of Storage Stability

The acid value per 100 parts by weight and the rate of viscosity increase are shown in Table 3 for each of the inks.

TABLE 3

| | Ink | Acid value per 100 parts by weight of ink (mg KOH) | Rate of viscosity increase (%) |
|---|---|---|---|
| Example 1 | 1 | 36 | 0 |
| Example 2 | 2 | 82.5 | 8.2 |
| Example 3 | 3 | 21 | −1.1 |
| Example 4 | 4 | 39 | 10.8 |
| Example 5 | 5 | 150 | 16.2 |
| Example 6 | 6 | 9 | 0.6 |
| Example 7 | 7 | 3 | 0.5 |
| Example 8 | 8 | 1.2 | 0.3 |
| Example 9 | 9 | 0.6 | 0.3 |
| Example 10 | 10 | 22.5 | 1.9 |
| Com. Ex. 1 | 51 | — | 15.3 |
| Com. Ex. 2 | 52 | 210 | 20.6 |

TABLE 3-continued

|  | Ink | Acid value per 100 parts by weight of ink (mg KOH) | Rate of viscosity increase (%) |
|---|---|---|---|
| Com. Ex. 3 | 53 | 255 | 25.9 |
| Com. Ex. 4 | 54 | 225 | 21.1 |
| Com. Ex. 5 | 55 | 270 | 50.0 |

As shown in Table 3, as for Inks 1 to 10 produced in Examples 1 to 10, the acid value per 100 parts by weight of the ink was not more than 150 mg KOH, and the rate of viscosity increase was not more than 17% (the inks were not cured even when they were left to stand in a dark room, and the inks were excellent in storage stability). Therefore, no bad influence is exerted on the application characteristics of the ink.

Further, when the acid value was 0.5 to 38 mg KOH, the ink was extremely excellent in storage stability, in which the viscosity was scarcely increased. Especially, when the acid value per 100 parts by weight of ink is not more than 36 mg KOH, then no increase in viscosity is observed even after being left to stand in the constant temperature bath for 2 weeks under the condition of 50° C., and the initial viscosity is almost maintained. Therefore, it is possible to obtain the ink which has the extremely excellent storage stability.

Any one of Inks 1 to 10 was excellent in pigment dispersion performance. The degree of dispersion was measured as follows. Sample 1 was prepared by diluting a small amount of the ink with 2-butanone, and dispersing the pigment in the ink by means of shaking with hand. On the other hand, Sample 2 was prepared by diluting a small amount of the ink with 2-butanone, and dispersing the pigment in the ink by using ultrasonic wave. The particle diameter of the pigment was measured for Samples 1 and 2 by using a particle size distribution-measuring apparatus (Micro-trac UPA-150). When the difference in measured value of the particle diameter is small between Sample 1 and Sample 2, it is acknowledged that the dispersion performance is excellent.

On the other hand, Ink 51 produced in Comparative Example 1 contained no surfactant. Although the rate of viscosity increase was 15.3%, the pigment dispersion performance was extremely unsatisfactory.

It is noted that the dispersion performance is improved by adding the surfactant having the polar functional group. When the acid value per 100 parts by weight of ink was not less than 0.5 mg KOH as in the inks produced in Examples 1 to 10, the inks exhibited such a characteristic that both of the dispersion performance and the satisfactory storage stability were provided.

As for Inks 52 to 55 produced in Comparative Examples 2 to 5, the acid value per 100 parts by weight was not less than 150 mg KOH, and the rate of viscosity increase was not less than 20% (the inks were cured when they were left to stand in a dark room, and the inks were inferior in storage stability).

It is desirable that the viscosity is not changed before and after the addition of various additives. The case, in which the surfactant as the additive is not added to the composition of the present invention, corresponds to Ink 51 of Comparative Example 1. When the acid value per 100 parts by weight of ink is not more than 150 mg KOH, an ink, which satisfies the foregoing requirement, is obtained (Exemplary Experiment 2), in view of any error brought about upon the measurement of the viscosity.

Next, the curing performance test was performed as follows for Inks 10 to 18 produced in Examples 10 to 18 and for Ink 51 produced in Comparative Example 1 and Inks 56 to 62 produced in Comparative Examples 6 to 12.

If the curing performance is unsatisfactory, then the curing of the ink caused by irradiation with light is insufficient, and any stickiness remains on the paint film surface. Accordingly, the presence or absence of the stickiness (tuck) after irradiation with light was used as an index to evaluate the curing performance.

(1) Method for Performing Curing Performance Test (i) The respective inks were applied onto a polyester film with BAR COATER #14 in a dark room. In this case, the amount of application was 0.0056 g/cm².

(ii) The ink applied onto the polyester film was irradiated with ultraviolet light in a totalized light amount of 160 mJ/cm².

Specifically, the polyester film applied with the ink was placed on a conveyer moving at 7.5 m/minute to allow the polyester film to pass under a fixed ultra-high voltage mercury lamp (output: 80 W/cm, illuminance: 80 mW/cm² at a position of the polyester film. The adopted apparatus was EYEMINI GRANDAGE ESC-151U (belt conveyer type, produced by EYE GRAPHICS, lamp output: 1.0 KW).

(iii) After the irradiation with ultraviolet light, the paint film of the ink was touched with fingers to judge whether or not the stickiness (tuck) existed.

(iv) If there is no stickiness, the experiment comes to end. If any tuck remains, the steps of (ii) and (iii) described above are repeated until the tuck disappears. The number of times of the ultraviolet radiation required to be performed until disappearance of the tuck is used as the TFT value.

(2) Result of Curing Performance Test

The amine value per 100 parts by weight and the TFT value of each of the inks are shown in Table 4.

TABLE 4

|  | Ink | Amine value per 100 parts by weight of ink (mg KOH) | TFT value (curing performance) |
|---|---|---|---|
| Example 10 | 10 | 12 | 1 |
| Example 11 | 11 | 22.95 | 1 |
| Example 12 | 12 | 19.5 | 2 |
| Example 13 | 13 | 16 | 1 |
| Example 14 | 14 | 8 | 1 |
| Example 15 | 15 | 3.2 | 1 |
| Example 16 | 16 | 1.6 | 1 |
| Example 17 | 17 | 0.8 | 1 |
| Example 18 | 18 | 14.5 | 1 |
| Com. Ex. 1 | 51 | 0 | 1 |
| Com. Ex. 6 | 56 | 24 | 10 |
| Com. Ex. 7 | 57 | 31.5 | 10 |
| Com. Ex. 8 | 58 | 78 | 10 |
| Com. Ex. 9 | 59 | 43.5 | 10 |
| Com. Ex. 10 | 60 | 34 | 3 |
| Com. Ex. 11 | 61 | 32 | 3 |
| Com. Ex. 12 | 62 | 29 | 3 |

As shown in Table 4, as for Inks 10 to 18 produced in Examples 10 to 18, the amine value per 100 parts by weight of ink was not more than 23 mg KOH, and the TFT value was not more than 2 (the inks were easily cured by the irradiation with ultraviolet light, and the inks were excellent in curing performance). Especially, when the amine value was 0.5 to 18 mg KOH, "TFT value=1" was satisfied, exhibiting more excellent curing characteristics.

Ink 10 produced in Example 10 was excellent in both of storage stability and curing performance as described above.

On the other hand, Ink 51 produced in Comparative Example 1 contained no surfactant. Although the TFT value was 1, the pigment dispersion performance was extremely unsatisfactory.

It is noted that the dispersion performance is improved by adding the surfactant having the polar functional group. When the amine value per 100 parts by weight of ink was not less than 0.5 mg KOH as in the inks produced in Examples 10 to 18, the ink exhibited such a characteristic that both of the dispersion performance and the satisfactory curing performance are provided.

As for Inks 56 to 62 produced in Comparative Examples 6 to 12, the amine value per 100 parts by weight was not less than 23 mg KOH, and the TFT value was not less than 3 (the inks were hardly cured even by being irradiated with ultraviolet light, and the inks were inferior in curing performance).

As for the effect to be exhibited by the addition of the surfactant, it is desired that the degree of freedom is wide to use any type of the surfactant when the material is selected. The composition of the present invention realizes a wide degree of freedom in view of the selection of the surfactant, because the amine value is not more than 23 mg KOH, concerning the curing characteristic upon the irradiation with light.

Further, the following facts are appreciated according to the results of the evaluation for Inks 1 to 18 produced in Examples 1 to 18 of the present invention.

(i) Inks 1 to 10 are excellent in storage stability owing to the fact that the acid value per 100 parts by weight is not more than 150 mg KOH. Inks 1 to 10 are not cured, for example, even after storage in the dark for a long period of time.

(ii) Inks 10 to 18 are excellent in curing performance owing to the fact that the amine value per 100 parts by weight is not more than 23 mg KOH. Inks 10 to 18 are quickly cured, for example, when they are exposed to a light beam having a predetermined wavelength after application to an objective.

Especially, Ink 10 is excellent in both of storage stability and curing performance, because the amine value per 100 parts by weight is not more than 23 mg KOH, and simultaneously the acid value per 100 parts by weight is not more than 150 mg KOH.

(iii) Inks 1 to 18 are excellent in pigment or dye dispersion performance owing to the fact that they contain the surfactant having the polar functional group.

The present invention is not limited at all to the embodiments described above, which may be carried out in other various forms within a range not deviating from the gist or essential characteristics of the present invention.

For example, in the illustrative embodiments described above, in order to clarify the result of comparison of the characteristics, the photocation-polymerizable resin is the same (composed of 3,4-epoxycyclohexyl-3,4-epoxycyclohexane carboxylate (70 parts by weight) as alicyclic epoxy and triethylene glycol divinyl ether (30 parts by weight) as vinyl ether compound) for all Examples. However, the photocation-polymerizable resin is not limited to the combination described above.

For example, more preferably, the photocation-polymerizable resin may be one comprising 60 to 90 parts by weight of alicyclic epoxy resin and 10 to 40 parts by weight of triethylene glycol divinyl ether as vinyl ether compound, and the alicyclic epoxy resin may be composed of 3,4-epoxycyclohexyl-3,4-epoxycyclohexane carboxylate and limonene dioxide or limonene monoxide.

In this case, it is preferable that 3,4-epoxycyclohexyl-3, 4-epoxycyclohexane carboxylate and limonene dioxide or limonene monoxide, which construct the alicyclic epoxy resin, are used in approximately equal blending amounts.

More preferably, the photocation-polymerizable resin may be constructed with a blending ratio, i.e., 40 parts by weight of 3,4-epoxycyclohexyl-3,4-epoxycyclohexane carboxylate, 40 parts by weight of limonene dioxide, and 20 parts by weight of triethylene glycol divinyl ether (i.e., with a blending ratio of 80 parts by weight of alicyclic epoxy resin and 20 parts by weight of vinyl ether compound).

What is claimed is:

1. An active energy beam curable composition comprising:
   a photocation-polymerizable substance;
   a photocation polymerization initiator; and
   a surfactant having polar functional groups, wherein:
   an acid value per 100 g of the active energy beam curable composition is not more than 150 mg KOH,
   wherein the acid value of the energy beam curable composition is determined by polar functional groups of the surfactant that are acidic functional groups, and
   wherein the acid value is not less than 0.5 mg KOH.

2. The active energy beam curable composition according to claim 1, wherein an amine value per 100 g of the active energy beam curable composition is not more than 23 mg KOH, and wherein the amine value of the energy beam curable composition is determined by polar functional groups of the surfactant that are basic functional groups.

3. The active energy beam curable composition according to claim 2, wherein the amine value is not less than 0.5 mg KOH.

4. The active energy beam curable composition according to claim 1, further comprising at least one of a pigment and a dye.

5. The active energy beam curable composition according to claim 1, wherein the photocation-polymerizable substance contains an epoxy resin compound.

6. The active energy beam curable composition according to claim 5, wherein the epoxy resin compound is an alicyclic epoxy resin compound.

7. The active energy beam curable composition according to claim 1, wherein the photocation-polymerizable substance contains a vinyl ether compound.

8. The active energy beam curable composition according to claim 1, wherein the photocation polymerization initiator contains an onium salt.

9. The active energy beam curable composition according to claim 5, wherein the active energy beam curable composition is an ink.

10. An active energy beam curable composition comprising:
    a photocation-polymerizable substance;
    a photocation polymerization initiator; and
    a surfactant having polar functional groups, wherein:
    an amine value per 100 of the active energy beam curable composition is not more than 23 mg KOH,
    wherein the amine value of the energy beam curable composition is determined by polar functional groups of the surfactant that are basic functional groups, and
    wherein the amine value is not less than 0.5 mg KOH.

11. The active energy beam curable composition according to claim 10, further comprising at least one of a pigment and a dye.

12. The active energy beam curable composition according to claim 10, wherein the photocation-polymerizable substance contains an epoxy resin compound.

13. The active energy beam curable composition according to claim 12, wherein the epoxy resin compound is an alicyclic epoxy resin compound.

14. The active energy beam curable composition according a claim 12, wherein the active energy beam curable composition is an ink.

15. The active energy beam curable composition according to claim 10, wherein the photocation-polymerizable substance contains a vinyl ether compound.

16. The active energy beam curable composition according to claim 10, wherein the photocation polymerization initiator contains an onium salt.

* * * * *